(12) United States Patent
Matsuno

(10) Patent No.: US 9,300,271 B2
(45) Date of Patent: Mar. 29, 2016

(54) IMPEDANCE MATCHING DEVICE

(71) Applicant: DAIHEN Corporation, Osaka-shi, Osaka (JP)

(72) Inventor: Daisuke Matsuno, Osaka (JP)

(73) Assignee: DAIHEN Corporation, Osaka (JP)

( * ) Notice: Subject to any disclaimer, the term of this patent is extended or adjusted under 35 U.S.C. 154(b) by 170 days.

(21) Appl. No.: 14/185,268

(22) Filed: Feb. 20, 2014

(65) Prior Publication Data

US 2014/0354173 A1    Dec. 4, 2014

(30) Foreign Application Priority Data

Jun. 4, 2013   (JP) ................................. 2013-118102

(51) Int. Cl.
| | |
|---|---|
| *H05B 41/16* | (2006.01) |
| *H03H 7/40* | (2006.01) |
| *H01J 37/32* | (2006.01) |

(52) U.S. Cl.
CPC ............ *H03H 7/40* (2013.01); *H01J 37/32183* (2013.01)

(58) Field of Classification Search
None
See application file for complete search history.

(56) References Cited

U.S. PATENT DOCUMENTS

| | | | | | |
|---|---|---|---|---|---|
| 5,971,591 | A * | 10/1999 | Vona | ................. | H01J 37/32935 219/121.54 |
| 5,982,099 | A * | 11/1999 | Barnes | ..................... | H05H 1/36 315/111.21 |
| 7,037,813 | B2 * | 5/2006 | Collins | ............. | H01J 37/32082 438/151 |
| 7,137,354 | B2 * | 11/2006 | Collins | ................. | H01J 37/321 118/723 I |
| 7,223,676 | B2 * | 5/2007 | Hanawa | ................... | C23C 14/48 257/E21.316 |
| 7,305,311 | B2 * | 12/2007 | van Zyl | ............. | H01J 37/32082 702/57 |
| 7,320,734 | B2 * | 1/2008 | Collins | ................. | H01J 37/321 118/726 |
| 9,082,591 | B2 * | 7/2015 | Dorf | ................. | H01J 37/32183 |
| 2010/0171428 | A1 * | 7/2010 | Kirchmeier | ....... | H01J 37/32045 315/111.21 |
| 2012/0318456 | A1 * | 12/2012 | Brouk | ............... | H01J 37/32009 156/345.28 |

FOREIGN PATENT DOCUMENTS

| | | |
|---|---|---|
| JP | 2004-085446 | 3/2004 |
| JP | 2008-300322 | 12/2008 |

* cited by examiner

*Primary Examiner* — Douglas W Owens
*Assistant Examiner* — Srinivas Sathiraju
(74) *Attorney, Agent, or Firm* — Hamre, Schumann, Mueller & Larson, P.C.

(57) ABSTRACT

An impedance matching device includes an input port connected to a high-frequency power supply, an output port connected to a load, an impedance variable circuit, a T-parameter memory for storing sets of T-parameters in a manner such that each of the sets of T-parameters is related to a corresponding one of adjustable impedance values of the device, an input voltage detector for detecting a forward wave voltage and a reflected wave voltage at the input port, and a p-p value calculator for computation of a p-p value of a high-frequency voltage at the output port. The computation of the p-p value of the high-frequency voltage is performed by using the forward wave voltage and the reflected wave voltage detected at the input port and also using one set of the T-parameters stored in the T-parameter memory.

6 Claims, 4 Drawing Sheets

$a_1 = T_{11} \cdot b_2 + T_{12} \cdot a_2 \qquad b_2 = T_{11} \cdot a_1 + T_{12} \cdot b_1$
$b_1 = T_{21} \cdot b_2 + T_{22} \cdot a_2 \qquad a_2 = T_{21} \cdot a_1 + T_{22} \cdot b_1$

| Adjust Number s | | Adjust Point $Y_m$ of $VC_2$ | | | |
|---|---|---|---|---|---|
| | | $Y_1$ | $Y_2$ | --- | $Y_M$ |
| Adjust Point $X_n$ of $VC_1$ | $X_1$ | 1 | 2 | --- | M |
| | $X_2$ | M+1 | M+2 | --- | 2M |
| | ⋮ | ⋮ | ⋮ | ⋮ | ⋮ |
| | $X_N$ | (N−1)×M +1 | (N−1)×M +2 | --- | N×M |

IMPEDANCE MATCHING DEVICE

BACKGROUND OF THE INVENTION

1. Field of the Invention

The present invention relates to an impedance matching device for performing impedance matching between a high-frequency power supply and a load.

2. Description of the Related Art

A plasma processing system for forming a thin semiconductor film or etching is conventionally known. In such a plasma processing system, high-frequency power is supplied from a high-frequency power supply to a plasma processing apparatus to generate plasma in the plasma processing apparatus. To efficiently supply high-frequency power from the high-frequency power supply to the plasma processing apparatus during the plasma processing, an impedance matching device is provided between the high-frequency power supply and the plasma processing apparatus. The impedance matching device operates to match the impedance of the high-frequency power supply and that of the plasma processing apparatus.

In the plasma processing system, the peak-to-peak value $V_{pp}$ (hereinafter referred to as "p-p value") of the high-frequency voltage at the input port of the plasma processing apparatus can indicate the condition of the semiconductor manufacturing process. The input port of the plasma processing apparatus is directly connected to the output port of the impedance matching device. Thus, in a conventional plasma processing system, the output port of the impedance matching device is provided with a $V_{pp}$ detector for detecting the p-p value $V_{pp}$ of the high-frequency voltage $v_{out}$ outputted from the output port to the plasma processing apparatus.

For instance, JP-A-2008-300322 discloses an impedance matching device, which has the structure shown in FIG. 6.

The impedance matching device 100 shown in FIG. 6 incorporates an impedance matching circuit 101a comprising a T-shaped circuit. The impedance matching circuit 101a is made up of an inductor L and two variable capacitors $C_1$, $C_2$ which are connected into a "T" shape. Between the variable capacitor $C_2$ and the output terminal RF-OUT are provided a $V_{pp}$ detector 101b and a $V_{dc}$ detector 101c. The $V_{dc}$ detector 101c detects the DC bias $V_{dc}$ of the high-frequency voltage $v_{out}$. The $V_{pp}$ detector 101b detects the p-p value $V_{pp}$ of the high-frequency voltage $v_{out}$ at the output terminal RF-OUT. The p-p value $V_{pp}$ is inputted into the controller 101d. The controller 101d controls the ignition in starting discharge and the impedance matching operation during the plasma processing in the plasma processing apparatus directly connected to the output terminal RF-OUT. Specifically, to assist the ignition in starting the discharge, the controller 101d adjusts the capacitances of the variable capacitors $C_1$, $C_2$ to increase the p-p value $V_{pp}$ while monitoring the p-p value $V_{pp}$ inputted from the $V_{pp}$ detector 101b.

In the structure disclosed in JP-A-2004-85446, the output port of the impedance matching device is provided with a high-frequency detector for detecting the high-frequency voltage, high-frequency current and phase difference between the high-frequency voltage and the high-frequency current. The detection results are used for detecting abnormalities such as an abnormal voltage or for controlling process parameters such as high-frequency power, gas flow rate, gas pressure supplied to the plasma processing apparatus. Since the high-frequency detector detects the instantaneous value of the high-frequency voltage, the high-frequency detector performs the function of detecting the p-p value $V_{pp}$ of the high-frequency voltage.

PATENT DOCUMENT

In the conventional impedance matching devices, a Vpp detector for directly detecting the p-p value $V_{pp}$ of a high-frequency voltage $v_{out}$ or a high-frequency detector is provided at the output port. This arrangement has the following disadvantages:

(1) The structure adjacent to the output port of the impedance matching device is complicated.
(2) The impedance matching device cannot be reduced in size.
(3) To detect the p-p value $V_{pp}$ of a high-frequency voltage $v_{out}$, circuits other than the $V_{pp}$ detector or the high-frequency detector are necessary, which hinders cost reduction.
(4) Maintenance of the $V_{pp}$ detector is necessary.

SUMMARY OF THE INVENTION

It is therefore an object of the present invention to provide an impedance matching device configured to find the p-p value of the high-frequency voltage outputted to a load without using a Vpp detector.

According to an embodiment of the present invention, there is provided an impedance matching device configured to be disposed between a high-frequency power supply and a load. The impedance matching device includes: an input port connected to the high-frequency power supply; an output port connected to the load; an impedance variable circuit having a plurality of impedance values to be selected; a T-parameter memory that stores sets of T-parameters relating to the impedance matching device in a manner such that each of the sets of T-parameters is related to a corresponding one of the plurality of impedance values; an input voltage detector that detects a forward wave voltage and a reflected wave voltage at the input port; and a p-p value calculator for computation of a p-p value of a high-frequency voltage at the output port, where the computation of the p-p value of the high-frequency voltage is performed by using the forward wave voltage and the reflected wave voltage detected at the input port and also using one set of T-parameters stored in the T-parameter memory.

Preferably, the above-mentioned one set of T-parameters corresponds to one of the plurality of impedance values that is set when the forward wave voltage and the reflected wave voltage are detected.

Preferably, the computation of the p-p value of the high-frequency voltage is performed by a following formula:

$$V_{pp} = 2 \cdot |[T_{11}(i) + T_{21}(i)] \cdot v_{fin}(i) + [T_{12}(i) + T_{22}(i)] \cdot v_{rin}(i)|$$

where $V_{pp}$ represents the p-p value of the high-frequency voltage; $T_{11}(i)$, $T_{21}(i)$, $T_{12}(i)$ and $T_{22}(i)$ represent the above-mentioned one set of T-parameters; $v_{fin}(i)$ represents the forward wave voltage at the input port; and $v_{rin}(i)$ represents the reflected wave voltage at the input port.

Preferably, the impedance matching device of the invention further comprises an abnormality detector and a safety countermeasure provider, where the abnormality detector is configured to detect an abnormality occurring at the load, and the safety countermeasure provider is configured to provide a predetermined countermeasure corresponding to the abnormality detected by the abnormality detector.

Preferably, the impedance matching device of the invention further comprises: an output voltage calculator that computes a forward wave voltage and a reflected wave voltage at the output port based on the forward wave voltage and the reflected wave voltage both detected by the input voltage detector and also on said one set of T-parameters; an input reflection coefficient calculator that computes: (a) sets of an estimated forward wave voltage and an estimated reflected wave voltage at the input port based on the computed forward wave voltage and the computed reflected wave voltage at the output port and also on the sets of 1-parameters, each set of the estimated forward wave voltage and the estimated reflected wave voltage corresponding to a respective one of the sets of T-parameters; and (b) reflection coefficients at the input port based on the sets of the estimated forward wave voltage and the estimated reflected wave voltage, each of the computed reflection coefficients corresponding to a respective one of the sets of the estimated forward wave voltage and the estimated reflected wave voltage; a specific impedance designator that selects an optimum reflection coefficient among the computed reflection coefficients and further designates one of the plurality of impedance values of the impedance variable circuit, the designated one of the plurality of impedance values corresponding to the optimum reflection coefficient; and an impedance adjuster that adjusts the impedance variable circuit based on the designated one of the plurality of impedance values.

In an embodiment of the present invention, the load includes a plasma processing apparatus.

With the above arrangements, there is no need to provide a detector or circuit at the output port for detecting the p-p value $V_{pp}$ of the high-frequency voltage. Thus, the size and manufacturing cost of the impedance matching device can be reduced. Further, no maintenance is required for such a p-p value detector, which contributes to the saving of time and cost.

DESCRIPTION OF THE PREFERRED EMBODIMENTS

Preferred embodiments of the present invention are described below with reference to the accompanying drawings.

Figure 1:
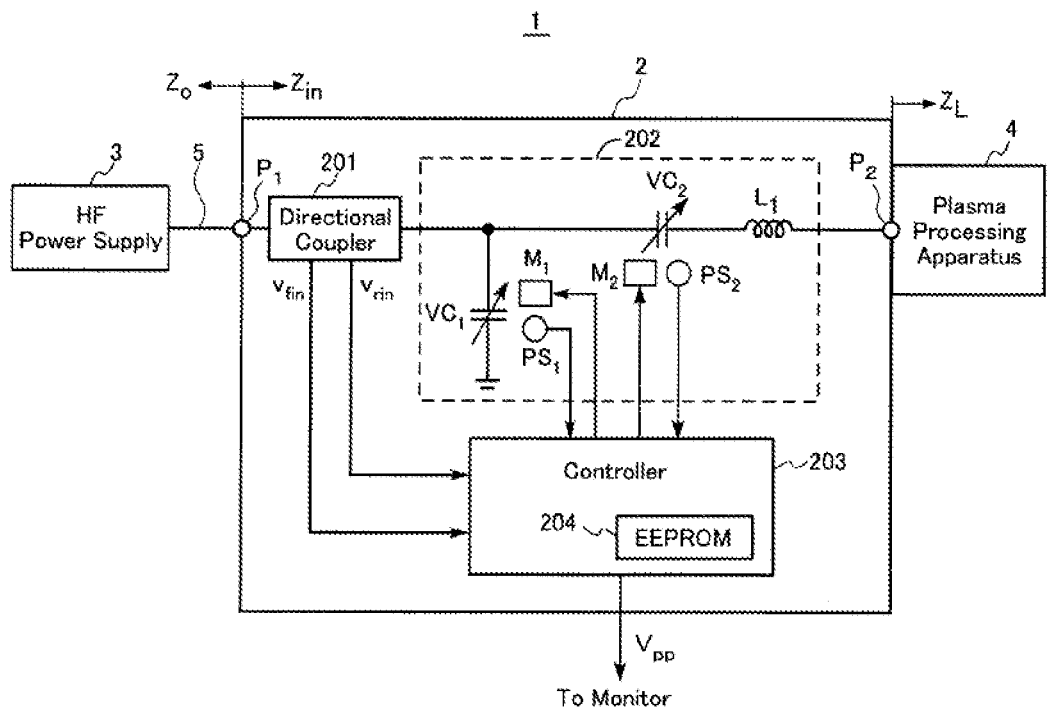
FIG. 1 shows the structure of a plasma processing system to which an impedance matching device according to an embodiment of the present invention is applied.

FIG. 1 shows the schematic structure of a plasma processing system to which an impedance matching device according to an embodiment of the present invention is applied.

The plasma processing system 1 shown in FIG. 1 includes an impedance matching device 2 according to the present invention, a high-frequency power supply 3, and a plasma processing apparatus 4. The high-frequency power supply 3 is connected to the input port $P_1$ of the impedance matching device 2 by a transmission cable 5 (e.g. a coaxial cable having a characteristic impedance $Z_o$ of 50Ω). The plasma processing apparatus 4 is directly connected to the output port $P_2$ of the impedance matching device 2.

The plasma processing apparatus 4 is an apparatus for performing e.g. thin film formation or etching by using plasma to an object such as a semiconductor wafer or a liquid crystal substrate. Specifically, for instance, fluorine-based gas and an object are sealed in a chamber, and a high-frequency power is applied to the chamber to generate a plasma. By using the plasma, thin film formation or etching is performed. Though not shown in the figure, in addition to the chamber for sealing a gas and an object, the plasma processing apparatus 4 includes a vacuum pump for adjusting the pressure in the chamber, and a pair of electrodes for discharging the applied high-frequency power.

The high-frequency power supply 3 supplies to the plasma processing apparatus 4 an electric power of a high frequency (e.g. 2.00 MHz, 13.56 MHz or 40.00 MHz) predetermined for the plasma processing system. In the plasma processing system 1, the profile of the output power of the high-frequency power supply 3 during the plasma processing is set in advance. In the plasma processing, a high-frequency power generated based on the profile set in advance is outputted from the high-frequency power supply 3 to the plasma processing apparatus 4.

Though not illustrated, the high-frequency power supply 3 incorporates a high-frequency signal generating circuit for generating a high-frequency signal (voltage signal). The high-frequency power supply 3 further incorporates a power amplifier such as a class-D amplifier for amplifying the high-frequency signal generated in the high-frequency signal generating circuit, and a DC-DC converter for applying DC voltage to the power amplifier. The high-frequency power supply 3 controls the DC voltage to be applied to the power amplifier based on the profile set in advance, thereby controlling the high-frequency power to be outputted from the power amplifier.

In the plasma processing apparatus 4, the state of conduction between the paired electrodes changes in accordance with change in the state of the object during the plasma processing. This changes the impedance $Z_L = R_L + j \cdot X_L$ seen from the output port $P_2$ of the impedance matching device 2 toward the plasma processing apparatus 4 (hereinafter referred to as "load impedance $Z_L$"). During the plasma processing, the impedance matching device 2 performs, at predetermined intervals, the matching operation to match the impedance of the high-frequency power supply 3 and the impedance of the plasma processing apparatus 4, so that the high-frequency power outputted from the high-frequency power supply 3 is efficiently supplied to the plasma processing apparatus 4 without being influenced by a change in the impedance of the plasma processing apparatus 4.

The impedance matching device 2 performs impedance matching of the high-frequency power supply 3 and the plasma processing apparatus 4 by e.g. a conventional impedance matching technique.

Specifically, the reflection coefficient $\Gamma_{in}$ at the input port $P_1$ of the impedance matching device 2 (hereinafter referred to as "input reflection coefficient $\Gamma_{in}$") is computed at predetermined intervals. The capacitances of the variable capacitor $VC_1$ and the variable capacitor $VC_2$ in the impedance matching device 2 are controlled so that the input reflection coefficient $\Gamma_{in}$ does not exceed a predetermined threshold $\Gamma_{th}$. For instance, the threshold $\Gamma_{th}$ is 0.1.

Specifically, when the number of variations of the capacitance of the variable capacitor $VC_1$ is N and the number of variations of the capacitance of the variable capacitor $VC_2$ is M, N×M impedance adjustment points P(s) (where s=1, 2, ... N×M), which are obtained by the combination of two variable capacitors $VC_1$ and $VC_2$, are set in the impedance matching device 2. Here, the number N and the number M may be equal to or different from each other.

With respect to each of the impedance adjustment points $P(_s)$, T-parameters $T_{11}, T_{12}, T_{21}, T_{22}$ are computed in advance. (Hereinafter, the T-parameters $T_{11}, T_{12}, T_{21}, T_{22}$ when the impedance matching device 2 is at an impedance adjustment point P(s) are expressed as $T_{11}(s), T_{12}(s), T_{21}(s), T_{22}(s)$, respectively.) By using the computed T-parameters, the process steps (1)-(4) described below are repeated in a predetermined cycle.

Note that, in the description below, the voltage at the input port $P_1$ of the impedance matching device 2 from the high-frequency power supply 3 toward the impedance matching device 2 is referred to as "forward wave voltage $v_{fin}$", whereas the voltage reflected from the impedance matching device 2 toward the high-frequency power supply 3 at the input port $P_1$ of the impedance matching device 2 is referred to as "reflected wave voltage $v_{rin}$." The voltage at the output port $P_2$ of the impedance matching device 2 from the impedance matching device 2 toward the plasma processing apparatus 4 is referred to as "forward wave voltage $v_{fout}$", whereas the voltage reflected from the plasma processing apparatus 4 toward the impedance matching device 2 at the output port $P_2$ of the impedance matching device 2 is referred to as "reflected wave voltage $v_{rout}$".

(1) The forward wave voltage $v_{fin}$ and the reflected wave voltage $v_{rin}$ at the input port $P_1$ are measured. (It is now assumed that the impedance matching device 2 is adjusted to an impedance adjustment point P(i) when the forward wave voltage $v_{fin}$ and the reflected wave voltage $v_{rin}$ are measured.)

(2) The forward wave voltage $v_{fout}$ and the reflected wave voltage $v_{rout}$ at the output port $P_2$ are computed by using the measurements of the forward and the reflected wave voltages $v_{fin}, v_{fin}$ and the T-parameters $T_{11}(i), T_{12}(i), T_{21}(i), T_{22}(i)$ corresponding to the impedance adjustment point P(i).

(3) Based on the forward and the reflected wave voltages $v_{fout}, v_{rout}$ and all the T-parameters $T_{11}(s), T_{12}(s), T_{21}(s), T_{22}(s)$ (where s=1, . . . N×M), estimation of the forward wave voltage $v_{fin}(s)$ and the reflected wave voltage $v_{rin}(s)$ at the input port $P_1$ when the impedance matching device 2 is adjusted to each of the impedance adjustment points P(s) are computed. Further, the reflection coefficient $\Gamma_{in}(s)$ corresponding to each of the impedance adjustment point P(s) is computed by $v_{rin}(s)/v_{fin}(s)$.

(4) From all of the reflection coefficients $\Gamma_{in}(_s)$ computed in this way, the minimum reflection coefficient $\Gamma_{in}(_j)$ is extracted. The impedance matching device 2 is adjusted to the impedance adjustment point $P(_j)$ corresponding to the minimum reflection coefficient $\Gamma_{in}(_j)$.

The impedance matching device 2 computes the p-p value $V_{pp}$ of the high-frequency voltage $v_{out}$ (synthesized voltage of the forward wave voltage $v_{fout}$ and the reflected wave voltage $v_{rout}$) at the output port $P_2$ at predetermined intervals during the plasma processing. The p-p value $V_{pp}$ is outputted to a monitoring device for monitoring the plasma processing system, and utilized, every time the plasma processing is performed, for e.g. checking the operation state of the plasma processing system, detecting abnormalities or anticipating the results of plasma processing. Specifically, for instance, the monitoring device compares the p-p value $V_{pp}$ with a predetermined threshold $V_{ppth}$ and determines that an abnormality has occurred when the p-p value $V_{pp}$ exceeds the threshold $V_{ppth}$. In this case, the monitoring device provides safety countermeasures, for example, notifies the abnormality by showing a massage or giving an alarm, or sends a signal to the high-frequency power supply 3 in order to stop the output of high-frequency power.

The impedance matching device 2 includes a directional coupler 201, an impedance variable circuit 202, a controller 203, and a nonvolatile memory 204. The impedance variable circuit 202 includes two variable capacitors $VC_1, VC_2$ and an inductor $L_1$. The controller 203 performs impedance matching by controlling the capacitance of each of the variable capacitors $VC_1$ and $VC_2$. The nonvolatile memory 204 stores data related to the capacitances of the variable capacitors $VC_1, VC_2$ and data related to T-parameters of the impedance matching device 2, which are necessary for the controller 203 to perform the impedance matching.

As the nonvolatile memory 204, an EEPROM is used in this embodiment. However, the nonvolatile memory 204 is not limited to an EEPROM, and other nonvolatile memories such as a flash memory may be used. Although the nonvolatile memory 204 is provided in the controller 203 in this embodiment, the nonvolatile memory 204 may be provided outside the controller 203.

The impedance variable circuit 202 is an L-shaped circuit in which the variable capacitor $VC_2$ and the inductor $L_1$ connected in series are connected to the variable capacitor $VC_1$. The inductance of the inductor $L_1$ is fixed. In each of the variable capacitors $VC_1, VC_2$, one of the two electrodes facing each other is a movable electrode that can be rotated by a motor, so that the overlapping surface area of the two electrodes can be changed.

The variable capacitor $VC_1$ is provided with a motor $M_1$ for rotating the movable electrode and a position sensor $PS_1$ for detecting the rotational position of the movable electrode. The detection signal from the position sensor $PS_1$ is inputted into the controller 203, and a driving signal (e.g. driving voltage) is inputted from the controller 203 to the motor $M_1$. The controller 203 controls the driving of the motor $M_1$ while monitoring the rotational position of the movable electrode based on the detection signal from the position sensor $PS_1$, whereby the capacitance of the variable capacitor $VC_1$ is controlled to a desired value selected from predetermined N different capacitances.

Similarly to the variable capacitor $VC_1$, the variable capacitor $VC_2$ is also provided with a motor $M_2$ for rotating the movable electrode and a position sensor $PS_2$ for detecting the rotational position of the movable electrode. The controller 203 controls the driving of the motor $M_2$ while monitoring the rotational position of the movable electrode based on the detection signal from the position sensor $PS_2$, whereby the capacitance of the variable capacitor $VC_2$ is controlled to a desired value selected from predetermined M different capacitances.

The directional coupler 201 is provided between the input port $P_1$ of the impedance matching device 2 and the input terminal of the impedance variable circuit 202. The directional coupler 201 separates the above-described forward wave voltage $v_{fin}$ and the above-described reflected wave voltage $v_{rin}$ from each other and outputs these voltages to the controller 203.

The controller 203 controls the impedance matching operation by the above-described impedance matching technique and the operation to compute the p-p value $V_{pp}$ of the high-frequency voltage $v_{out}$. The controller 203 includes a microcomputer provided with a CPU (Central Processing Unit), a ROM (Read Only Memory) and a RAM (Random Access Memory), and the nonvolatile memory 204. The CPU performs the processing program stored in the ROM, whereby the impedance matching operation and the operation to compute the p-p value $V_{pp}$ are performed. Instead of the microcomputer, an FPGA (Field Programmable Gate Array) may be employed.

The computation of the p-p value $V_{pp}$ of the high-frequency voltage $v_{out}$ at the output port $P_2$ of the impedance matching device 2 and the impedance matching according to the present invention are described below.

First, the computation of the p-p value $V_{pp}$ of the high-frequency voltage $v_{out}$ at the output port $P_2$ is described.

Figure 2:
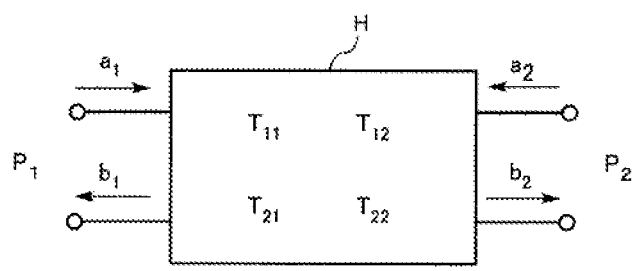
FIG. 2 is a diagram for explaining T-parameters of a four-terminal network.

When the impedance matching device 2 is treated as a four-terminal network shown in FIG. 2, the relationship between the forward wave (wave going into the four-terminal network) and the reflected wave (wave coming out of the four-terminal network) voltages $a_1$, $b_1$ on the input port $P_1$ side and the reflected wave (wave going into the four-terminal network) and the forward wave (wave coming out of the four-terminal network) voltage $a_2$, $b_2$ on the output port $P_2$ side is given by the equations (1) and (2) below, by using T-parameters (Transmission Parameter) ($T_{11}$, $T_{22}$, $T_{22}$, $T_{22}$):

$$\begin{bmatrix} b_2 \\ a_2 \end{bmatrix} = \begin{bmatrix} T_{11} & T_{12} \\ T_{21} & T_{22} \end{bmatrix} \begin{bmatrix} a_1 \\ b_1 \end{bmatrix} \quad (1)$$

$$\begin{bmatrix} a_1 \\ b_1 \end{bmatrix} = \begin{bmatrix} T_{11} & T_{12} \\ T_{21} & T_{22} \end{bmatrix}^{-1} \begin{bmatrix} b_2 \\ a_2 \end{bmatrix} \quad (2)$$

The input port $P_1$ and output port $P_2$ of the impedance matching device 2 correspond to the input port $P_1$ and the output port $P_2$ shown in FIG. 2, respectively. The forward wave voltage $a_1$ and the reflected wave voltage $b_1$ correspond to the forward wave voltage $v_{fin}$ and the reflected wave voltage $v_{rin}$ in FIG. 1, respectively. The reflected wave voltage $a_2$ and the forward wave voltage $b_2$ correspond to the reflected wave voltage $v_{rout}$ and the forward wave voltage $v_{rout}$ in FIG. 1, respectively. Thus, the forward wave voltage $v_{fout}$ and the reflected wave voltage $v_{rout}$ at the output port $P_2$ are given by the equations (3) and (4) below:

$$v_{fout} = T_{11} \cdot v_{fin} + T_{12} \cdot v_{rin} \quad (3)$$

$$v_{rout} = T_{21} \cdot v_{fin} + T_{22} \cdot v_{rin} \quad (4)$$

Since the high-frequency voltage $v_{out}$ at the output port $P_2$ is obtained by combining the forward wave voltage $v_{fout}$ and the reflected wave voltage $v_{rout}$ at the output port $P_2$, the high-frequency voltage $v_{out}$ is given by:

$$v_{out} = v_{fout} + v_{rout}$$

Thus, the p-p value $V_{pp}$ of the high-frequency voltage $v_{out}$ is given by the equations (5) and (5') below:

$$V_{pp} = 2 \cdot |v_{out}| = 2 \cdot |v_{fout} + v_{rout}| \quad (5)$$

$$= 2 \cdot |[T_{11} + T_{21}] \cdot v_{fin} + [T_{12} + T_{22}] \cdot v_{rin}| \quad (5')$$

As will be understood from the equation (5'), the p-p value $V_{pp}$ of the high-frequency voltage $v_{out}$ is obtained based on the measurements of the forward wave voltage $v_{fin}$ and the reflected wave voltage $v_{fin}$ at input port $P_1$ and the T-parameters $T_{11}$, $T_{12}$, $T_{21}$, $T_{22}$ of the impedance matching device 2 when the measurement is performed.

For instance, when the forward wave voltage $v_{fin}$ and the reflected wave voltage $v_{fin}$ at the input port $P_1$ which are measured when the impedance matching device 2 is at the impedance adjustment point P(i) are expressed as $v_{fin}(i)$ and $v_{rin}(i)$ respectively, and T-parameters corresponding to the adjustment point P(i) are expressed as $T_{11}(i)$, $T_{12}(i)$, $T_{21}(i)$, $T2_2(i)$, the p-p value $V_{pp}(i)$ of the high-frequency voltage $v_{out}$ when the measurement is performed is given by the equation (6) below:

$$V_{pp}(i) = 2 \cdot |[T_{11}(i) + T_{21}(i)] \cdot v_{fin}(i) + [T_{12}(i) + T_{22}(i)] \cdot v_{rin}(i)| \quad (6)$$

In this embodiment, data on T-parameters $T_{11}(s)$, $T_{12}(s)$, $T_{21}(s)$, $T_{22}(s)$ of the impedance matching device 2 are obtained in advance with respect to all the impedance adjustment points P($_s$) (s=1, 2, ... N×M) and stored in the nonvolatile memory 204 of the controller 203.

Here, the data on T-parameters $T_{11}(s)$, $T_{12}(s)$, $T_{21}(s)$, $T_{22}(s)$ include the data on S-parameters (Scattering Parameter) $S_{11}(s)$, $S_{12}(s)$, $S_{21}(s)$, $S_{22}(s)$ measured with respect to each of the adjustment points P(s) by using a network analyzer, data on the program for computation of the equation (7) below to convert the S-parameters into T-parameters $T_{11}(s)$, $T_{12}(s)$, $T_{21}(s)$, $T_{22}(s)$, or the data on the T-parameters $T_{11}(s)$, $T_{12}(s)$, $T_{21}(s)$, $T_{22}(s)$ after conversion from S-parameters $S_{11}(s)$, $S_{12}(s)$, $S_{21}(s)$, $S_{22}(s)$ by the computation of the equation (7).

$$\begin{bmatrix} T_{11} & T_{12} \\ T_{21} & T_{22} \end{bmatrix} = \frac{1}{S_{12}} \begin{bmatrix} S_{12} \cdot S_{21} - S_{11} \cdot S_{22} & S_{22} \\ -S_{11} & 1 \end{bmatrix} \quad (7)$$

During the plasma processing, the impedance matching device 2 measures the forward wave voltage $v_{fin}$ and the reflected wave voltage $v_{rin}$ at the input port $P_1$ at predetermined intervals and computes the p-p value $V_{pp}(i)$ of the high-frequency voltage $v_{out}$ at the output port $P_2$ by performing the computation expressed by the equation (6) above, using the measurements $v_{fin}$, $v_{rin}$ and the T-parameters $T_{11}(i)$, $T_{12}(i)$, $T_{21}(i)$, $T_{22}(i)$ corresponding to the impedance adjustment point P(i) to which the impedance matching device 2 is currently set. The p-p value $V_{pp}(i)$ obtained is outputted to a monitoring device.

Figures 3, 4:
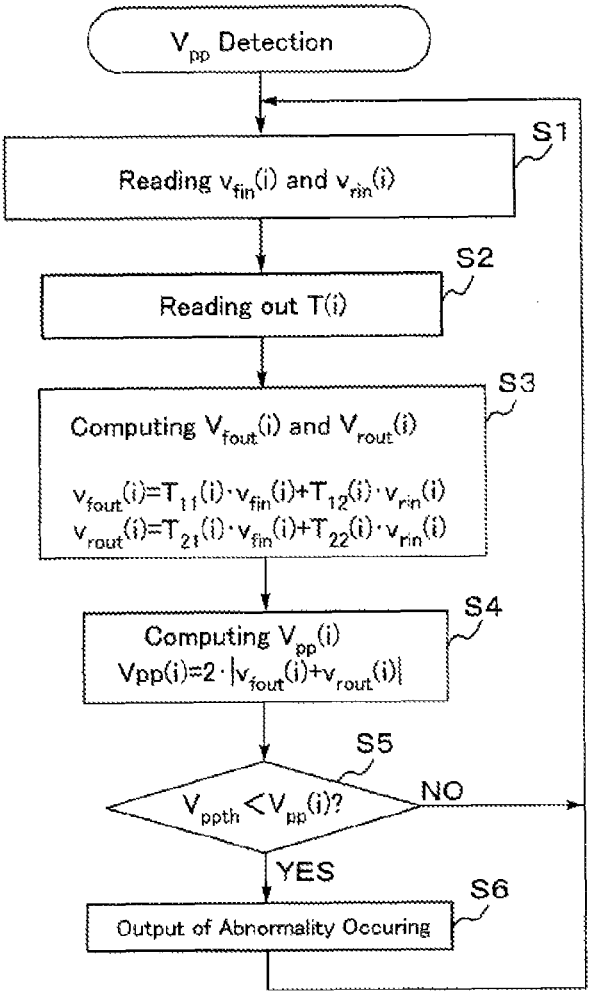
FIG. 3 shows an image of data storage regions in a non-volatile memory which store information on T-parameters.
FIG. 4 is a flowchart of computation of the p-p value of high-frequency voltage at the output port.

FIG. 3 shows an image of data storage regions in the nonvolatile memory 204 which store data necessary for impedance matching or computation of the p-p value $V_{pp}$.

The nonvolatile memory 204 has M×N storage regions corresponding to M×N different sets of an adjustment point $X_n$ (where n=1, 2 ... N) of the variable capacitor $VC_1$ and an adjustment point $Y_n$ (where n=1, 2 ... N) of the variable capacitor $VC_2$. i.e., $(X_1, Y_1)$, $(X_1, Y_2)$, ... $(X_1, Y_M)$, $(X_2, Y_1)$, $(X_2, Y_2)$, ... $(X_2, Y_M)$ ... $(X_N, Y_1)$, $(X_N, Y_2)$, ... $(X_N, Y_M)$. An address is allotted to each of the storage regions. For instance, when an adjustment number "s" (=1, 2, ... N×M) is given in the order of $(X_1, Y_1)$, $(X_1, Y_2)$, ... $(X_1, Y_M)$, $(X_2 Y_1)$, $(X_2, Y_2)$, ... $(X_2, Y_M)$ ... $(X_N, Y_1)$, $(X_N, Y_2)$, ... $(X_N, Y_M)$ values corresponding to the adjustment numbers "s" are allotted.

Thus, in the address corresponding to the impedance adjustment point P(s) of $(X_n, Y_m)$ data on the adjustment point $X_n$ (corresponding to the rotational position of the movable electrode of the variable capacitor $VC_1$) and the adjustment point $Y_m$ (corresponding to the rotational position of the movable electrode of the variable capacitor $VC_2$) are stored. The T-parameters $T_{11}(s)$, $T_{21}(s)$, $T_{21}(s)$, $T_{22}(s)$ obtained by converting the measurements of S-parameters $S_{11}(s)$, $S_{21}(s)$, $S_{21}(s)$, $S_{22}(s)$ are stored in the storage region of the address corresponding to the impedance adjustment point P(s).

The data on the computation program for the equation (7) may be stored in a ROM in the controller 203, and measurements of S-parameters $S_{11}(s)$, $S_{12}(s)$, $S_{21}(s)$, $S_{22}(s)$ may be stored in the storage region corresponding to the impedance adjustment point P(s) in the nonvolatile memory 204 without being converted into T-parameters $T_{11}(s)$, $T_{12}(s)$, $T_{21}(s)$, $T_{22}(s)$. In this case, S-parameters $S_{11}(s)$, $S_{12}(s)$, $S_{21}(s)$, $S_{22}(s)$ are read out from the nonvolatile memory 204 in the computation processing of the p-p value $V_{pp}$, and converted into T-parameters $T_{11}(s)$, $T_{22}(s)$, $T_{22}(s)$, $T_{22}^2(s)$ by conducting the computation of the equation (7) above.

FIG. 4 is a flowchart of the computation of the p-p value $V_{pp}$ of the high-frequency voltage $v_{out}$ by the controller 203. The process shown in this flowchart includes determination as to whether or not an abnormality has occurred during the plasma processing, based on the obtained the p-p value $V_{pp}$. Thus, during the plasma processing, the controller 203 repeats the process shown in FIG. 4 at predetermined intervals, thereby computing the p-p value $V_{pp}$ of the high-frequency voltage $v_{out}$ while also determining whether or not an abnormality has occurred based on the obtained the p-p value $V_{pp}$, and sending the determination result to a monitoring device.

Unlike the process shown in FIG. 4, the obtained p-p value Vpp may be outputted to a monitoring device, and the determination as to whether or not an abnormality has occurred may be performed in the monitoring device.

When the plasma processing is started, the controller 203 first reads the forward wave voltage $v_{fin}(i)$ and the reflected wave voltage $v_{rin}(i)$ inputted from the directional coupler 201 (S1). The expression (i) of $v_{fin}(i)$ and $v_{rin}(i)$ indicates that the impedance matching device 2 is at the impedance adjustment point P(i) when the forward wave voltage $v_{fin}$ and the reflected wave voltage $v_{rin}$ are read.

Then, the controller 203 reads out the T-parameters $T_{11}(i)$, $T_{12}(i)$, $T_{21}(i)$, $T_{22}(i)$ corresponding to the impedance adjustment point P(i) from the nonvolatile memory 204 (S2). The controller 203 then performs computation of equations (3) and (4) to compute the forward wave voltage $V_{fout}(i)$ and the reflected wave voltage $v_{rout}(i)$ at the output port $P_2$(S3).

Then, the controller 203 performs the computation of equation (5) by using the obtained forward wave voltage $v_{fout}$ and reflected wave voltage $v_{rout}$, to obtain the p-p value $V_{pp}(i)$ of the high-frequency voltage $v_{out}$ at the output port $P_2$(S4). Then, the p-p value $V_{pp}$ is compared with a predetermined threshold $V_{ppth}$(in S5).

When $V_{pp}(i) \leq V_{ppth}$ (No in S5) the controller 203 determines that no abnormality has occurred, and the process returns to S1. When $V_{ppth} < V_{pp}(i)$ (Yes in S5) the controller 203 determines that an abnormality has occurred, and outputs information to notify the monitoring device of the abnormality (S6). Then, the process returns to S1.

When the monitoring device outputs an emergency stop signal to the controller 203 upon receiving information on the abnormality from the impedance matching device 2, the controller 203 finishes the process shown in FIG. 4.

In the process shown in FIG. 4, after the forward wave voltage $v_{fout}(i)$ and the reflected wave voltage $v_{rout}(i)$ at the output port $P_2$ are computed in S3 by the computation of equations (3) and (4), the p-p value $V_{pp}(i)$ of the high-frequency voltage $v_{out}$ is computed in S4 by the computation of equation (5). Unlike this, however, the p-p value $V_{pp}(i)$ of the high-frequency voltage $v_{out}$ may be directly computed by the computation of equation (5'), without computing the forward wave voltage $v_{fout}(i)$ and the reflected wave voltage $v_{rout}(i)$.

Although the p-p value $V_{pp}(i)$ of the high-frequency voltage $v_{out}$ computed in S4 is not outputted to the monitoring device in the process shown in FIG. 4, the p-p value $V_{pp}(i)$ may be outputted to the monitoring device between S4 and S5. Further, outputting an emergency stop signal or alarm of an abnormality may be performed by the controller 203, instead of the monitoring device.

The p-p value $V_{pp}$ computation process shown in FIG. 4 is described as a process performed independently from the impedance matching process. However, since the controller 203 performs the impedance matching at predetermined intervals as its main control operation, p-p value $V_{pp}$ computation process may be performed in combination with the impedance matching.

Since the impedance matching process uses T-parameters $T_{11}(s)$, $T_{12}(s)$, $T_{21}(s)$, $T_{22}(s)$ similarly to the p-p value $V_{pp}(i)$ computation process, these processes can be efficiently performed in combination.

Figure 5:
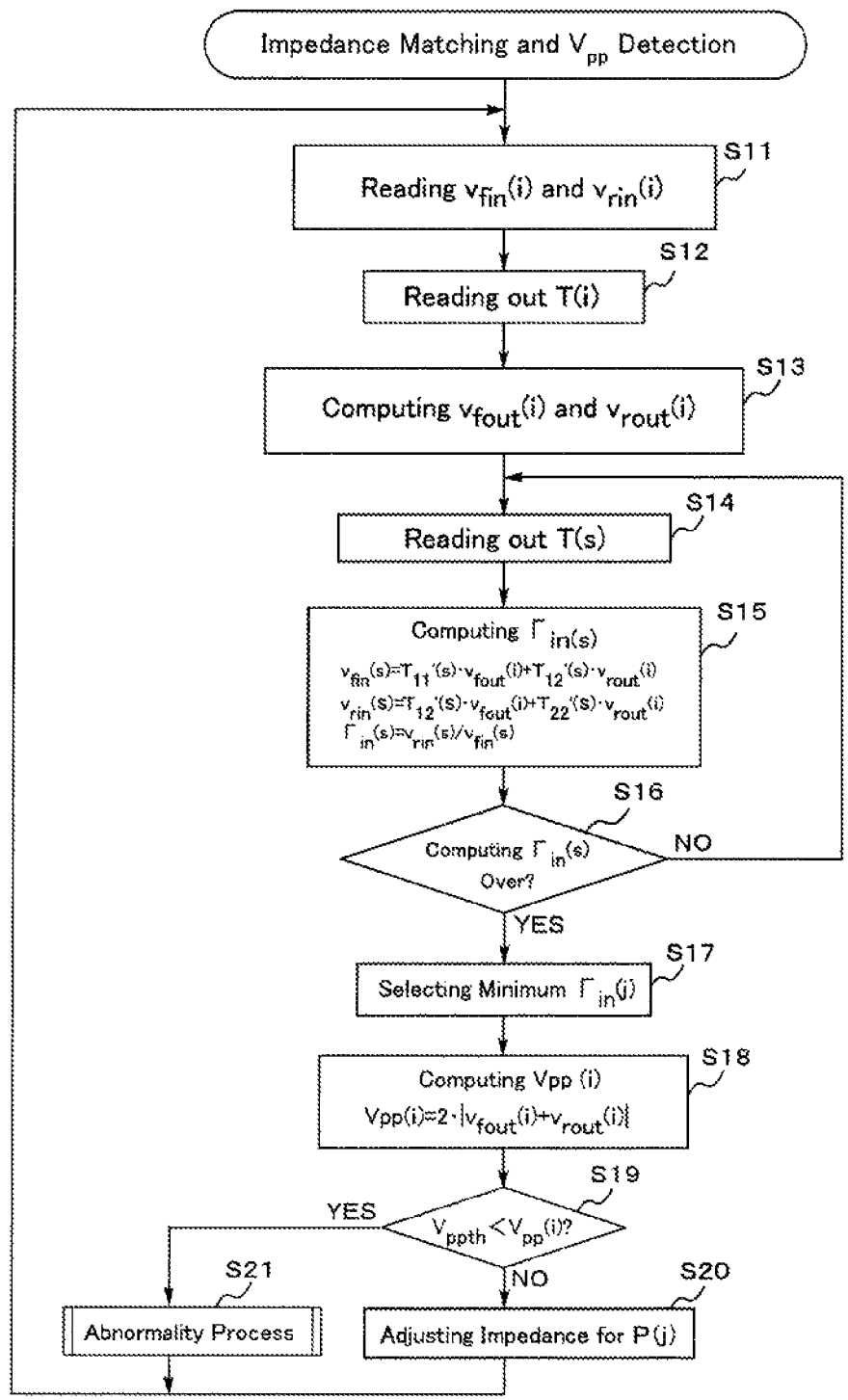
FIG. 5 is a flowchart of the computation of the p-p value of high-frequency voltage and the impedance matching by the impedance matching device.
Figure 6:
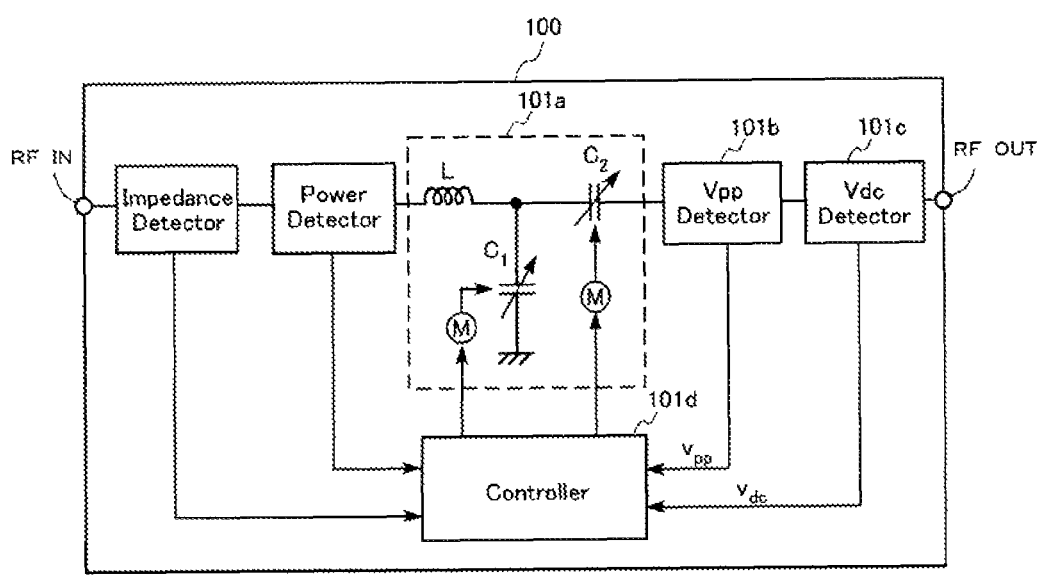
FIG. 6 shows an example of conventional impedance matching device incorporating a Vpp detector.

FIG. 5 is a flowchart of the process in which the p-p value $V_{pp}$ computation and the impedance matching are performed in combination. During the plasma processing, the controller 203 repeats the process shown in FIG. 5 at predetermined intervals, thereby performing impedance matching, computation of the p-p value $V_{pp}$ of the high-frequency voltage $v_{out}$, and abnormality detection.

When the plasma processing is started, the controller 203 first reads the forward wave voltage $v_{fin}(i)$ and the reflected wave voltage $v_{rin}(i)$ inputted from the directional coupler 201 (S11). Then, the controller 203 reads from the nonvolatile memory 204 the T-parameters $T_{11}(i)$, $T_{12}(i)$, $T_{21}(i)$, $T_{22}(i)$ corresponding to the impedance adjustment point P(i) (S12). The controller 203 then performs computation of equations (3) and (4) to compute the forward wave voltage $v_{fout}(i)$ and the reflected wave voltage $v_{rout}(i)$ at the output port $P_2$(S13).

Then, the controller 203 reads from the nonvolatile memory 204 all the T-parameters $T_{11}(s)$, $T_{12}(s)$, $T_{21}(s)$, $T_{22}(s)$ corresponding to the adjustment points P(s) in the order of the adjustment number s (s=1, 2, . . . N×M) (S14). By using the T-parameters $T_{11}(s)$, $T_{12}(s)$, $T_{21}(s)$, $T_{22}(s)$ and the forward wave voltage $v_{fout}(i)$ and the reflected wave voltage $v_{rout}(i)$, the controller 203 performs the computation of equation (2) above, thereby computing estimation of the forward wave voltage $v_{fin}(s)$ and the reflected wave voltage $v_{rin}(s)$ at the input port $P_1$ when the impedance variable circuit 202 is adjusted to each of the impedance adjustment points P(s). The controller 203 further performs the computation of $v_{rin}(s)/v_{fin}(s)$ to compute estimation of the input reflection coefficient $\Gamma_{in}(s)$ corresponding to each of the impedance adjustment points P(s) (S15).

It is to be noted that the equation (8) below is obtained when the T-parameters $T_{11}(s)$, $T_{12}(s)$, $T_{21}(s)$, $T_{22}(s)$ and the forward wave voltage $v_{fout}(i)$ and the reflected wave voltage $v_{rout}(i)$ are assigned to the equation (2) above:

$$\begin{bmatrix} v_{fin}(s) \\ v_{rin}(s) \end{bmatrix} = \begin{bmatrix} T_{11}(s) & T_{12}(s) \\ T_{21}(s) & T_{22}(s) \end{bmatrix}^{-1} \begin{bmatrix} v_{fout}(i) \\ v_{rout}(i) \end{bmatrix} \quad (8)$$

When the elements of the inverse matrix $T^{-1}$ of T-parameters are expressed as ($T_{11}'$, $T_{12}'$, $T_{21}'$, $T_{22}'$) the following holds:

$$\begin{bmatrix} T_{11}'(s) & T_{12}'(s) \\ T_{21}'(s) & T_{22}'(s) \end{bmatrix} = \frac{1}{T_{11}(s) \cdot T_{22}(s) - T_{12}(s) \cdot T_{21}(s)} \begin{bmatrix} T_{22}(s) & -T_{12}(s) \\ -T_{21}(s) & T_{11}(s) \end{bmatrix}$$

Provided that the load impedance $Z_L$ is fixed, the best impedance matching is achieved when the apparatus is adjusted to the impedance adjustment point (j) at which the smallest input reflection coefficient $\Gamma_{in}(J)$ among all the input reflection coefficients $\Gamma_{in}(s)$ is obtained.

This is why estimation of the input reflection coefficient $\Gamma_{in}(s)$ is computed in S15 by the computation of $v_{rin}(s)/v_{fin}(s)$ after the forward wave voltage $v_{fin}(s)$ and the reflected wave voltage $v_{rin}(s)$ at the input port $P_1$ when the variable capacitors $VC_1$, $VC_2$ of the impedance variable circuit 202 are adjusted to each of the (N×M) impedance adjustment points P(s) is computed by using the estimation of forward wave voltage $V_{fout}(i)$ and the reflected wave voltage $v_{rout}(i)$.

When computation of estimation of all the input reflection coefficients $\Gamma_{in}(s)$ corresponding to each of the impedance adjustment points P(s) is completed (Yes in S16), the controller 203 extracts the smallest reflection coefficient $\Gamma in(j)$ (S17). Then, the controller 203 performs the computation of equation (5) by using the forward wave voltage $V_{fout}(i)$ and the reflected wave voltage $v_{rout}(i)$ computed in S13, thereby obtaining the p-p value $V_{pp}(i)$ of the high-frequency voltage $v_{out}$ at the output port $P_2$ (S18). The controller 203 compares the obtained p-p value $V_{pp}(i)$ with a predetermined threshold $V_{ppth}$(S19).

When $V_{pp}(i) \leq V_{ppth}$ (No in S19), the controller 203 determines that no abnormality has occurred and sets the impedance variable circuit 202 to the impedance adjustment point P(j) corresponding to the smallest input reflection coefficient $\Gamma_{in}(j)$ extracted in S17 (S20). The process then returns to S1. When $V_{ppth} < V_{pp}(i)$ (Yes in S19), the controller 203 determines that an abnormality has occurred and deals with the abnormality by e.g. outputting information to notify the monitoring device of the abnormality (S21). Then, the process returns to S1.

In this embodiment, the minimum input reflection coefficient $\Gamma_{in}(j)$ is extracted from the estimation of N×M input reflection coefficients $\Gamma_{in}(s)$ in S17. Unlike this, the input reflection coefficient $\Gamma_{in}(r)$ closest to a predetermined target value $\Gamma_c$ of the input reflection coefficient may be extracted. That is, in the case where impedance matching is considered to be realized when the input reflection coefficient $\Gamma_{in}$ is not larger than a certain threshold $\Gamma_{th}$, the threshold $\Gamma_{th}$ can be set as the target value $T_c$. The impedance variable circuit 202 can be set to the impedance adjustment point P(r) at which the input reflection coefficient $\Gamma_{in}(r)$ is closest to the threshold $\Gamma_{th}$. This arrangement does not pose any problems.

In this case, the N×M impedance adjustment points P(s) may be divided into a plurality of groups, and extraction of the input reflection coefficient $\Gamma in(r)$ is performed successively with respect to each of the groups. When the input reflection coefficient $\Gamma in(r)$ close to the threshold $\Gamma_{th}$ is found in one of the groups, the impedance adjustment point P(r) corresponding to the input reflection coefficient $\Gamma in(r)$ may be employed as the proper impedance matching point. This technique realizes quick extraction of the input reflection coefficient. Since the reflection coefficient $\Gamma$ is a value not smaller than 0, setting the threshold $\Gamma_{th}$ to 0 is substantially equivalent to extracting the smallest input reflection coefficient $\Gamma in(j)$ from estimation of N×M input reflection coefficients $\Gamma in(s)$.

Although the p-p value $V_{pp}(i)$ of the high-frequency voltage $v_{out}$ computed in S18 is not outputted to the monitoring device in the process shown in FIG. 5, the p-p value $V_{pp}(i)$ of the high-frequency voltage $v_{out}$ may be outputted to the monitoring device between S18 and S19. The output of an emergency stop signal or notification of an abnormality may be performed by the controller 203 instead of the monitoring device.

As described above, according to this embodiment, information related to T-parameters of the impedance matching device 2 is obtained in advance with respect to all of the impedance adjustment points P(s) of the impedance variable circuit 202. During the plasma processing, the p-p value $V_{pp}(i)$ of the high-frequency voltage $v_{out}$ can be obtained at predetermined intervals by performing the computation of equation (6) by using the T-parameters corresponding to the impedance adjustment point P(i) to which the impedance matching device 2 is currently set and measurements of the forward wave voltage $v_{fin}(i)$ and the reflected wave voltage $v_{rin}(i)$ at the input port $P_1$. Thus, a device such as a Vpp detector for directly detecting the p-p value Vpp(i) of the high-frequency voltage $v_{out}$ does not need to be provided at the output port $P_2$.

Thus, the impedance matching device 2 has a simple circuit structure, which leads to reduction in size and cost of the impedance matching device 2. Generally, stray capacitance between the parts in the impedance matching device and the case or an inductance component of the wiring and so on adversely affect the impedance matching accuracy. By simplifying the circuit structure of the impedance matching device 2, such adverse effect of stray capacitance and so on on the impedance matching accuracy is reduced.

When a device such as a $V_{pp}$ detector is provided, work or equipment for maintaining the detection accuracy of the device is required. Since a $V_{pp}$ detector or the like is not provided in this embodiment, time or cost for the maintenance is not necessary.

The amount of computation necessary for obtaining the p-p value $V_{pp}$ of the high-frequency voltage $v_{out}$ is considerably small as compared with the amount of computation for impedance matching using T-parameters. Thus, even when the operation for obtaining the p-p value $V_{pp}$ is added to the periodic impedance matching operation in the impedance matching device 2, the computation load is not excessively increased.

Thus, an impedance matching device having both of the function of impedance matching and the function of p-p value $V_{pp}$ detection can be easily modified to an impedance matching device that does not have the p-p value Vpp detection function just by modifying the program installed in the impedance matching device.

Although computation of the p-p value $V_{pp}$ is performed in combination with the impedance matching that uses T-parameters in this embodiment, computation of the p-p value $V_{pp}$ may be performed in combination with other types of impedance matching, such as that disclosed in JP-A-2003-302431, for example.

The impedance variable circuit 202 of this embodiment is an L-shaped circuit in which the variable capacitor $VC_2$ and the inductor $L_1$ connected in series are connected to the variable capacitor $VC_1$. However, other circuit structures such as an inverted L-shaped circuit, T-shaped circuit or π-shaped circuit may be employed. Although variable capacitors are used as variable elements in this embodiment, other kinds of variable elements such as variable inductors may be used instead.

The invention claimed is:

1. An impedance matching device configured to be disposed between a high-frequency power supply and a load, the matching device comprising:
   an input port connected to the high-frequency power supply;
   an output port connected to the load;
   an impedance variable circuit having a plurality of impedance values to be selected;
   a T-parameter memory that stores sets of T-parameters relating to the impedance matching device in a manner such that each of the sets of T-parameters is related to a corresponding one of the plurality of impedance values;
   an input voltage detector that detects a forward wave voltage and a reflected wave voltage at the input port; and
   a p-p value calculator for computation of a p-p value of a high-frequency voltage at the output port;
   wherein the computation of the p-p value of the high-frequency voltage is performed by using the forward wave voltage and the reflected wave voltage detected at the input port and also using one set of T-parameters stored in the T-parameter memory, wherein the computation of the p-p value of the high-frequency voltage is performed by a following formula:

$$V_{pp}=2\cdot|[T_{11}(i)+T_{21}(i)]\cdot v_{fin}(i)+[T_{12}(i)+T_{22}(i)]\cdot v_{rin}(i)|$$

where $V_{pp}$ represents the p-p value of the high-frequency voltage; $T_{11}(i)$, $T_{21}(i)$, $T_{12}(i)$ and $T_{22}(i)$ represent said one set of T-parameters; $v_{fin}(i)$ represents the forward wave voltage at the input port; and $v_{rin}(i)$ represents the reflected wave voltage at the input port.

2. The impedance matching device according to claim 1, wherein said one set of T-parameters corresponds to one of the plurality of impedance values that is set when the forward wave voltage and the reflected wave voltage are detected.

3. The impedance matching device according to claim 1, further comprising an abnormality detector and a safety countermeasure provider, wherein the abnormality detector is configured to detect an abnormality occurring at the load, and the safety countermeasure provider is configured to provide a predetermined countermeasure corresponding to the abnormality detected by the abnormality detector.

4. An impedance matching device configured to be disposed between a high-frequency power supply and a load, the matching device comprising:

an input port connected to the high-frequency power supply;

an output port connected to the load;

an impedance variable circuit having a plurality of impedance values to be selected;

a T-parameter memory that stores sets of T-parameters relating to the impedance matching device in a manner such that each of the sets of T-parameters is related to a corresponding one of the plurality of impedance values;

an input voltage detector that detects a forward wave voltage and a reflected wave voltage at the input port; and a p-p value calculator for computation of a p-p value of a high-frequency voltage at the output port;

wherein the computation of the p-p value of the high-frequency voltage is performed by using the forward wave voltage and the reflected wave voltage detected at the input port and also using one set of T-parameters stored in the T-parameter memory, the impedance matching device further comprising:

an output voltage calculator that computes a forward wave voltage and a reflected wave voltage at the output port based on the forward wave voltage and the reflected wave voltage both detected by the input voltage detector and also on said one set of T-parameters;

an input reflection coefficient calculator that computes: (a) sets of an estimated forward wave voltage and an estimated reflected wave voltage at the input port based on the computed forward wave voltage and the computed reflected wave voltage at the output port and also on the sets of T-parameters, each set of the estimated forward wave voltage and the estimated reflected wave voltage corresponding to a respective one of the sets of T-parameters; and (b) reflection coefficients at the input port based on the sets of the estimated forward wave voltage and the estimated reflected wave voltage, each of the computed reflection coefficients corresponding to a respective one of the sets of the estimated forward wave voltage and the estimated reflected wave voltage;

a specific impedance designator that selects an optimum reflection coefficient among the computed reflection coefficients and further designates one of the plurality of impedance values of the impedance variable circuit, the designated one of the plurality of impedance values corresponding to the optimum reflection coefficient; and an impedance adjuster that adjusts the impedance variable circuit based on the designated one of the plurality of impedance values.

5. The impedance matching device according to claim 1, wherein the load comprises a plasma processing apparatus.

6. The impedance matching device according to claim 4, wherein the load comprises a plasma processing apparatus.

* * * * *